United States Patent
Flanders et al.

(10) Patent No.: US 7,415,049 B2
(45) Date of Patent: Aug. 19, 2008

(54) LASER WITH TILTED MULTI SPATIAL MODE RESONATOR TUNING ELEMENT

(75) Inventors: Dale C. Flanders, Lexington, MA (US); Mark E. Kuznetsov, Lexington, MA (US); Walid A. Atia, Lexington, MA (US)

(73) Assignee: Axsun Technologies, Inc., Billerica, MA (US)

( * ) Notice: Subject to any disclaimer, the term of this patent is extended or adjusted under 35 U.S.C. 154(b) by 81 days.

(21) Appl. No.: 11/158,617

(22) Filed: Jun. 22, 2005

(65) Prior Publication Data

US 2006/0215713 A1 Sep. 28, 2006

Related U.S. Application Data

(60) Provisional application No. 60/665,716, filed on Mar. 28, 2005.

(51) Int. Cl.
*H01S 3/10* (2006.01)
(52) U.S. Cl. .......................................... 372/20
(58) Field of Classification Search ............... None
See application file for complete search history.

(56) References Cited

U.S. PATENT DOCUMENTS

| | | | |
|---|---|---|---|
| 3,962,576 A * | 6/1976 | Kuhl et al. | 250/201.9 |
| 4,504,950 A | 3/1985 | AuYeung | |
| 4,907,237 A | 3/1990 | Dahmani et al. | |
| 4,914,662 A * | 4/1990 | Nakatani et al. | 372/32 |
| 5,121,399 A | 6/1992 | Sorel et al. | |
| 5,159,601 A * | 10/1992 | Huber | 372/6 |
| 6,115,401 A | 9/2000 | Scobey et al. | |
| RE37,051 E | 2/2001 | Welch et al. | |
| 6,282,213 B1 | 8/2001 | Gutin et al. | |
| 6,301,274 B1 | 10/2001 | Tayebati et al. | |
| 6,339,603 B1 | 1/2002 | Flanders et al. | |

(Continued)

FOREIGN PATENT DOCUMENTS

EP  0 516 332 A2  12/1992

(Continued)

OTHER PUBLICATIONS

Uenishi, Yuji, "Coupled-Cavity Laser Diode with Micromachined External Mirror," NTT Interdisciplinary Research Laboratories in Tokyo, Japan, in IEEE/LEOS 1996 Summer Topical Meetings: Optical MEMS and Their Applications, Keystone CO, 1996, pp. 33-34.

(Continued)

*Primary Examiner*—Minsun Harvey
*Assistant Examiner*—Sean Hagan
(74) *Attorney, Agent, or Firm*—Houston Eliseeva LLP (57) ABSTRACT

An external cavity laser has a mirror-based resonant tunable filter, such as a Fabry Perot tunable filter or Gires-Tournois interferometer tuning element, with the tunable filter being preferably used as a laser cavity mirror. A mirror-based resonant tunable filter is selected in which the spectral response in reflection has an angular dependence. A tilt scheme is used whereby by selecting an appropriate angle between the filter's nominal optical axis and the cavity optical axis, a narrowband peak spectral reflection is provided to the laser cavity. This tunable narrowband spectral reflection from the filter is used to lock and tune the laser output wavelength.

20 Claims, 11 Drawing Sheets

U.S. PATENT DOCUMENTS

| | | | |
|---|---|---|---|
| 6,345,059 | B1 | 2/2002 | Flanders |
| 6,373,632 | B1 | 4/2002 | Flanders |
| 6,393,035 | B1 * | 5/2002 | Weingarten et al. ........... 372/18 |
| 6,424,466 | B1 | 7/2002 | Flanders |
| 6,608,711 | B2 | 8/2003 | Flanders et al. |
| 6,698,941 | B2 | 3/2004 | Yokoyama |
| 6,778,565 | B2 * | 8/2004 | Spuehler et al. ............... 372/25 |
| 6,847,661 | B2 | 1/2005 | Jerman et al. |
| 6,897,951 | B2 | 5/2005 | Womble et al. |
| 7,027,472 | B2 | 4/2006 | Flanders |
| 2002/0196548 | A1 * | 12/2002 | Kuznetsov .................. 359/578 |
| 2002/0196817 | A1 * | 12/2002 | Little .......................... 372/20 |
| 2005/0008045 | A1 | 1/2005 | Xie et al. |
| 2005/0134962 | A1 | 6/2005 | Verghese |

FOREIGN PATENT DOCUMENTS

| | | |
|---|---|---|
| EP | 0 709 659 A2 | 5/1996 |
| FR | 2 661 785 A1 | 11/1991 |
| WO | WO 95/13638 | 5/1995 |

OTHER PUBLICATIONS

Sidorin, Yakov, et al., "Demonstration of a Tunable Hybrid Laser Diode Using an Electrostatically Tunable Silicon Micromachined Fabry-Perot Interferometer Device," IEEE Photonics Technology Letters, vol. 11, No. 1, Jan. 1999, pp. 18-20.

Chu, Daniel, et al., "Optical networks promote tunable laser development," Laser Focus World, Aug. 2001, 6 pages.

Zorabedian, P., et al., "Interference-filter-tuned, alignment-stabilized, semiconductor external-cavity laser," Optics Letters, vol. 13, No. 10, Oct. 1988, pp. 826-828.

Kranendonk, Laura A., et al., "Modeless operation of a wavelength-agile laser by high-speed cavity length changes," Optical Society of America, Optics Express, vol. 13, No. 5, Mar. 7, 2005, pp. 1498-1507.

Johlen, Dietmar, et al., "Narrow-band-mode converting Fabry-Perot output coupler for fiber lasers," OFC '98 Technical Digest, 1998, pp. 372-373.

Johlen, Dietmar, et al., "Fiber Fabry-Perot Interferometer with Mode-Converting Bragg Gratings," Journal of Lightwave Technology, vol. 18, No. 11, Nov. 2000, pp. 1575-1582.

Arnaud, Jacques, A., et al., "Walk-Off Effects in Fabry-Perot Diplexers," IEEE Transactions on Microwave Theory and Techniques, vol. MTT-22, No. 5, May 1974, pp. 486-493.

International Search Report from International Patent Application PCT/US2006/005611, filed Feb. 17, 2006.

International Report on Patentability dated Oct. 3, 2007 from PCT/US2006/005611 filed on Feb. 17, 2006.

* cited by examiner

LASER WITH TILTED MULTI SPATIAL MODE RESONATOR TUNING ELEMENT

RELATED APPLICATIONS

This application claims the benefit under 35 USC 119(e) of Provisional application No. 60/665,716, filed Mar. 28, 2005, which is incorporated herein by reference in its entirety.

BACKGROUND OF THE INVENTION

Temperature tuning is one of the most common approaches for controlling the wavelength of semiconductors lasers. This is a relatively simple technique to implement since the semiconductor laser chips are often mounted on thermoelectric coolers. By varying the drive current to a chip's cooler in response to a thermistor signal, for example, the output wavelength from the semiconductor laser chip can be stabilized or modulated.

The problem with temperature tuning is its range limitations. The lasers can usually only be tuned over a relatively small range of a few nanometers. As a result, temperature tuning finds limited application to telecommunications systems or spectroscopy applications in which only a small spectral band is to be accessed.

When wider tuning ranges are required, external cavity laser (ECL) configurations are more common. Semiconductor ECL systems usually combine a semiconductor gain chip and an external tuning element that provides wavelength selective feedback into the semiconductor chip.

Most commonly the semiconductor gain chip used in these ECLs is an edge emitting semiconductor optical amplifier (SOA). Either reflective SOAs, in which one of the facets is coated for reflectivity, or more conventional SOAs, in which both facets of the SOA are antireflection (AR) coated, can be used. These coatings prevent the chip from lasing on its own facet's feedback, allowing for the creation of the external cavity configuration in which the spectral makeup of the feedback is controlled by the tuning element.

There are a large variety of ECL cavity configurations. In some examples, the tuning element is located in the middle of the cavity between the reflectors that define the laser cavity. In other examples, the tuning element is located at one end of the cavity, functioning as both a laser cavity mirror and tuning element.

U.S. Pat. No. 6,345,059, entitled, "Short Cavity Tunable Laser with Mode Position Compensation," and U.S. Pat. No. 6,339,603, entitled, "Tunable Laser with Polarization Anisotropic Amplifier for Fabry-Perot Filter Reflection Isolation" illustrate ECLs using a Fabry-Perot filter tuning element that is located in the middle of the laser cavity.

The location of the Fabry-Perot tuning element in the middle of the cavity can render these ECL designs somewhat complex to manufacture. Isolation is required on either side of the Fabry-Perot tunable filter. This isolation ensures that the laser functions in response to the transmission filter function of the Fabry-Perot tunable filter, rather than its broadband or notch filter function reflection. The transmission of a Fabry-Perot tunable filter spectrally appears as an Airy function with a series of spectrally separated Lorentzian passbands, which are separated by the free spectral range of the filter. Generally, the laser gain chip locks onto one of these passbands to thereby define the wavelength of the ECL. The isolation is important because, in reflection, the Fabry-Perot tunable filter appears as a notch filter, providing very broadband reflection except for the relatively narrow band that is transmitted.

On the other hand, Fabry-Perot tuning elements have some advantages. They can be manufactured using robust microelectro-mechanical system (MEMS) technologies. Moreover, these ECL cavity configurations can provide relatively broad tuning ranges, only limited by the chip gain bandwidth and the effective bandwidth of the isolation elements.

Isolation for intracavity Fabry-Perot tuning elements, at least those using flat-flat mirrors, can be achieved with simpler configurations. An article by P. Zorabedian, et al. in Optics Letters, Vol. 13, No. 10, October 1988, entitled, "Interference-Filter-Tuned, Alignment-Stabilized, Semiconductor External-Cavity Laser," discloses a semiconductor ECL using an interference or resonant etalon filter. The filter is angled relative to the optical axis of the ECL cavity. As a result, light is reflected at an angle to the laser cavity's optical axis by the interference filter and is therefore not coupled back into the semiconductor gain medium; this angling avoids the need for discrete intracavity isolation elements. In contrast, light that is transmitted through the interference filter, being on resonance, oscillates within the laser cavity and is therefore amplified by the chip gain medium.

A similar system was disclosed in U.S. Pat. No. 4,504,950 to AuYeung. There, a gap was used to form an intra-cavity etalon to create, in combination with a laser diode, an external cavity laser configuration. A micro-electrical and mechanical translator was used to tune this gap and thereby control the wavelength of the output. The gap was angled relative to the laser cavity in order to ensure that the laser diode locked on the resonant feedback transmission from the etalon and not the off-resonance light.

The lasers described in U.S. Pat. No. 4,504,950 and the Zorabedian article use resonant filters that are constructed from two flat mirrors. Such resonant filters support a continuum of plane wave spatial modes. Thus, these filters can be angled tuned as in the Zorabedian article by changing the angle the modal plane wave makes with the optical axis of the resonator. Or, they can be tuned by varying the optical gap, as disclosed in U.S. Pat. No. 4,504,950. In either case, the flat-flat resonator cavities avoid problems stemming from higher order spatial modes from the filters affecting the filter transmission characteristics. The angle isolation strategy, usable with these flat-flat mirror filters, provides a much simpler cavity design and therefore eases the manufacturing challenges over systems as described in U.S. Pat. Nos. 6,345,059 and 6,339,603.

The isolation problems characteristic of these Fabry-Perot based ECLs are not encountered in some other ECL configurations. Another class of ECLs uses grating or holographic tuning elements. Here, the most common ECL configurations are termed Littman-Metcalf and Littrow. In the Littrow design, the emission from a gain element, such as a laser diode or reflective SOA, is directed to a grating. A portion of the light from the grating is reflected to provide narrow band feedback into the SOA through its AR coated facet, whereas another portion of the beam grazes off of the grating to form the output beam. The spatial distribution of the spectrum by the grating presents only narrow band feedback into the semiconductor chip. In the Littman-Metcalf configuration, the output through AR coated facet of a reflective SOA facet is directed to a grating. A portion of the light grazes to form the output beam. Another portion is reflected toward a turning mirror that then retro-reflects the light to the grating and back into the SOA through the AR coated front facet. Tuning in the Littrow configuration is performed by mechanically rotating the grating, which changes its effective pitch. This tuning, however, also changes the position of the output beam. In contrast, in the Littman-Metcalf configuration, the rotating mirror varies the effective grating pitch and tunes the laser. There is little movement in the output beam since the grating is usually not moved, however.

These grating based ECLs are commercially available. Most recently, relatively compact semiconductor laser systems with MEMS grating tuning have been developed and commercialized.

A further class of ECLs is based on coupled cavity configurations. One example is shown in WIPO Publication No. WO 95/13638, in which a resonant filter is formed between a back facet of a laser chip and a MEMS, electrostatically-driven reflecting element. By changing the size of this rear cavity, it is suggested that the output of the laser is tuned. A similar system is disclosed in a paper entitled, "Coupled-Cavity Laser Diode with Micromachined External Mirror," by Yuji Uenishi from NTT Interdisciplinary Research Laboratories in Tokyo, Japan, in IEEE/LEOS 1996 Summer Topical Meetings: Optical MEMS and Their Applications, Keystone CO, pp. 33-34, 1996.

SUMMARY OF THE INVENTION

Present invention concerns ECLs that use resonant, preferably mirror-based, tunable filters, such as Fabry Perot tunable filters or Gires-Tournois interferometers.

A tilt scheme is employed in order to control the spectral reflection characteristics of the filter and to provide light feedback from the filter into the laser cavity, with the filter being used as a laser cavity mirror in some configurations.

A mirror-based resonant tunable filter is selected in which the spectral response in reflection has an angular dependence. One example of such a filter is a Fabry-Perot filter comprising at least one curved mirror such that it supports higher order confined spatial modes. In such a device, filter angle relative to the laser cavity optical axis determines filter function shape of the retroreflected light, and filter's resonator cavity length primarily determines the center wavelength of filter function. Thus, by selecting an appropriate angle between the filter's nominal optical axis and the cavity's optical axis, the laser gain medium can be caused to lock onto a narrowband spectral reflection peak that is fed back to the gain medium. Specifically, by using a resonant filter that supports multiple spatial modes, the filter can be angled relative to the laser cavity axis such that the spectral response of the retro-reflected light is a narrowband peak. The laser emission wavelength is then set by tuning the spectral position of this peak, which is controlled by adjusting the filter cavity length, for example.

In general, according to one aspect, the invention features a tunable semiconductor external cavity laser. The laser comprises a semiconductor gain medium for amplifying light within a laser cavity. A resonant tunable filter, having an angular dependent spectral response, is used to provide feedback into the cavity. The tunable filter is angled relative to the laser cavity optical axis in order to provide narrowband reflection to the laser. Tuning the reflective resonant filter tunes the light output wavelength of the laser cavity.

In the preferred embodiment, the semiconductor gain medium comprises an edge-emitting gain chip such as a semiconductor optical amplifier. This can be a reflective SOA or a SOA that has AR coatings on both facets.

In other implementations, however, a vertical cavity surface emitting laser (VCSEL) device can be used, however.

In the current embodiment, the resonant reflective tunable filter forms one end of the laser cavity, such that the filter functions as the laser's partially reflective output mirror through which the output light is taken. The resonant tunable filter supports multiple transverse spatial modes, while the semiconductor gain chip typically supports only the fundamental spatial mode. Feedback into the laser cavity is provided at least partially by at least one higher order spatial mode of the filter. In some examples, a long laser cavity is used such as one provided by a length of optical fiber. Laser output is typically provided or launched into a single mode optical fiber or a polarization maintaining optical fiber.

In general, according to another aspect, the invention features a tunable semiconductor external cavity laser. This comprises a semiconductor gain medium for amplifying light within a laser cavity. A resonant tunable filter supports multiple spatial modes to create an angular dependent spectral reflection response. The filter is angularly positioned to provide spectrally narrowband feedback into the laser cavity.

In general, according to another aspect, the invention relates to a method for configuring an optical system. This method comprises arranging a resonant tunable filter, supporting multiple spatial modes, to provide a narrowband spectral reflection response to another optical component and tuning an optical size of a cavity of the resonant tunable filter in order to control a center wavelength of the narrowband spectral reflection response provided to the optical component.

In this way, the resonant filter can be used in optical systems in place of the conventional grating.

In general, according to another aspect, the invention relates to a spectroscopy method. This method comprises amplifying light within a laser cavity and coupling the light to a resonant tunable filter having an angular dependent spectral reflection response. This filter is tuned to generate a tunable signal from the laser cavity, which signal is applied to an article of interest. By detecting light returning from the article of interest, a spectroscopic response of the article is resolved. In this way, the inventive system can be applied to spectroscopy systems and applications.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 1-A is a plot of filter reflectivity, in retroreflection, as function of wavelength or frequency (both arbitrary units) for the resonant filter 200;

DETAILED DESCRIPTION OF THE PREFERRED EMBODIMENTS

A number of different types of resonant optical filters exist. Generally, they all comprise two or more mirrors or a ring waveguide structure defining one or more resonant cavities.

Probably the most common example is the Fabry-Perot resonant filter or interferometer. A Fabry-Perot resonator is typically a linear resonator or cavity, which usually has highly reflecting end mirrors. The end mirrors are often plane but also can be curved, typically with spherical curvature. The Fabry-Perot resonator is often made short enough to achieve a sufficiently large free spectral range; the bandwidth of the resonances is then the free spectral range divided by the resonator finesse. The resonance frequencies are often tuned via cavity length changes.

Gires-Tournois interferometers (GTI) are another example of resonant filters. See, F. Gires, and P. Tournois, "Interferometre utilisable pour la compression d'impulsions lumineuses modulees en frequence", C.R. Acad. Sci. Paris 258, 6112-6115 (1964). A Gires-Tournois interferometer is an optical standing-wave cavity designed to generate dispersion. The front mirror is partially reflective, while the back mirror has a high reflectivity approaching unity reflectivity. If no losses occur in the cavity, the power reflectivity is unity at all wavelengths, but the phase of the reflected light is frequency-dependent due to the cavity effect, causing group delay dispersion. Moreover, if the cavity supports multiple spatial modes, then the reflected spectral response will have an angular dependence.

Still a further example, which may not require mirrors, is the ring resonator. These devices can be constructed from multimode fiber or waveguide rings and couplers.

Figure 1:
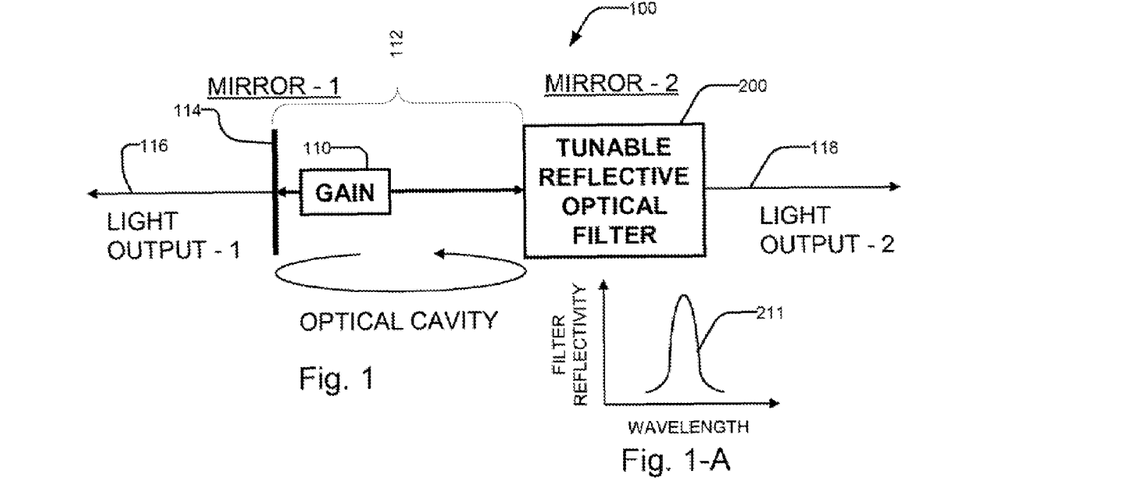
FIG. 1 is a schematic block diagram illustrating an external cavity laser according to the present invention.

FIG. 1 shows an external cavity resonate filter laser 100 that has been constructed according to the principles of the present invention.

Generally, the laser 100 comprises a gain medium 110.

This gain medium 110 can be a solid state laser medium, such as Nd:YAG, Ti:sapphire, alexandrite, rare-earth (e.g., Er, Tm) doped bulk glass, waveguide, or optical fiber, or a dye cell for example. These gain media can be diode or flashlamp pumped.

However, in the preferred embodiment, the gain medium 110 is a semiconductor gain medium. Common material systems are based on III-V semiconductor materials, including binary materials, such as GaN, GaAs, InP, GaSb, InAs, as well as ternary, quaternary, and pentenary alloys, such as InGaN, InAlGaN, InGaP, AlGaAs, InGaAs, GaInNAs, GaInNAsSb, AlInGaAs, InGaAsP, AlGaAsSb, AlGaInAsSb, AlAsSb, InGaSb, InAsSb, and InGaAsSb, operating anywhere over the 400 nanometer (run) to 2000 nm and longer wavelength ranges extending into multiple micrometer wavelengths. Semiconductor quantum well gain regions are typically used to obtain especially wide gain bandwidth that allows ultra wide laser wavelength tuning. The chip gain medium is configured as a semiconductor optical amplifier. Edge-emitting or VCSEL chips are used in different implementations.

The semiconductor gain medium 110 provides gain within a laser cavity 112 extending between mirror-1 114 and mirror-2, which in this embodiment is the tunable reflective resonant optical filter 200.

The tunable reflective optical filter 200 provides a filter reflectivity that is illustrated in FIG. 1-A. Specifically, it provides narrowband feedback 211 into the filter cavity 112 and thus the semiconductor gain chip 110 in order to set the frequency of the external cavity laser 100. Typically the bandwidth of the feedback is less then 10 nm wide(FWHM). More often, it is less than 5 nm wide, and preferably about 2-3 nm or less, FWHM.

In the illustrated embodiment, light output from the laser cavity 112 is provided through mirror-1 114, see reference numeral 116, or the tunable reflective resonant optical filter light 200, see reference numeral 118. In other embodiments, the output is taken from within the cavity such as by a fold mirror or other tap. The advantage of taking the output through mirror-1 is higher power since coupling loss into the filter 200 is minimized. Taking the output through mirror-2/tunable filter 200 has the advantage of minimizing or suppressing broadband optical noise due to amplified spontaneous emission (ASE) from the chip 110.

Figure 2:
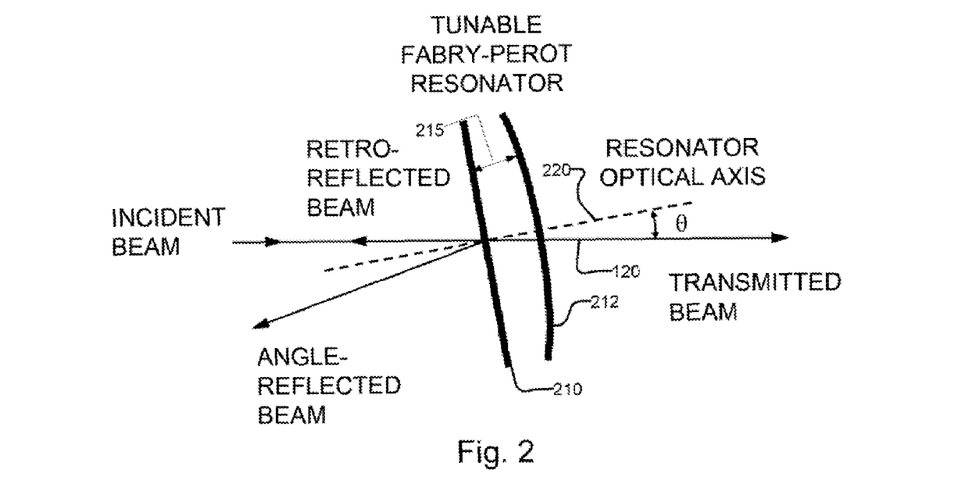
FIG. 2 is a side plan cross-sectional view illustrating the positioning of a tunable resonant filter to provide retroreflective feedback into the laser cavity according to the present invention.

FIG. 2 illustrates a preferred embodiment of the tunable reflective resonant optical filter 200 and its positioning relative to the laser cavity optical axis 120.

In one embodiment, the resonant filter 200 is manufactured as described in U.S. Pat. Nos. 6,608,711 or 6,373,632, which are incorporated herein by this reference.

This tunable reflective resonant optical filter 200 would typically be referred to as a Fabry-Perot resonant filter or a GTI. In the current embodiment, a curved flat resonator structure is used. Thus, the resonant optical filter 200 comprises a generally flat mirror 210 and an opposed curved mirror 212, defining a filter optical cavity 215, the optical length of which able to be modulated.

In general, reflectivities $R_1$ and $R_2$ of the two filter constituent mirrors 210 and 212, respectively are substantially the same or different, by design. We define mirror asymmetry of the resonant filter by the ratio $T_{rat}$=T2/T1 of the transmissions of the two mirrors, where T1=1−R1 and T2=1−R2. Mirror reflectivity product R1*R2 determines filter finesse, while filter mode bandwidth is given by the ratio of the filter free spectral range and filter finesse. Filter free spectral range is in turn determined by the optical length of the filter cavity.

The optical axis 220 of the resonant filter 200, defined as radial to curved mirror 212 and orthogonal to flat mirror 210, is angled relative to the optical axis 120 of the laser cavity 112. In the illustrated example, the angle between the nominal axis of the resonant filter 120 and the optical axis of the laser cavity or incident beam is θ.

By angling the resonant filter 200 and because this resonant filter 200 supports higher order spatial nodes, the reflection from the tunable filter 200 into the laser cavity 112 can be adjusted in order to provide a narrow band spectral reflection peak, instead of the spectral reflection notch typically associated with Fabry-Perot tunable filters. Optical frequency, or wavelength, of this spectral reflection peak can be tuned by varying the mirror gap of the Fabry-Perot or GTI structure.

Figure 3A:
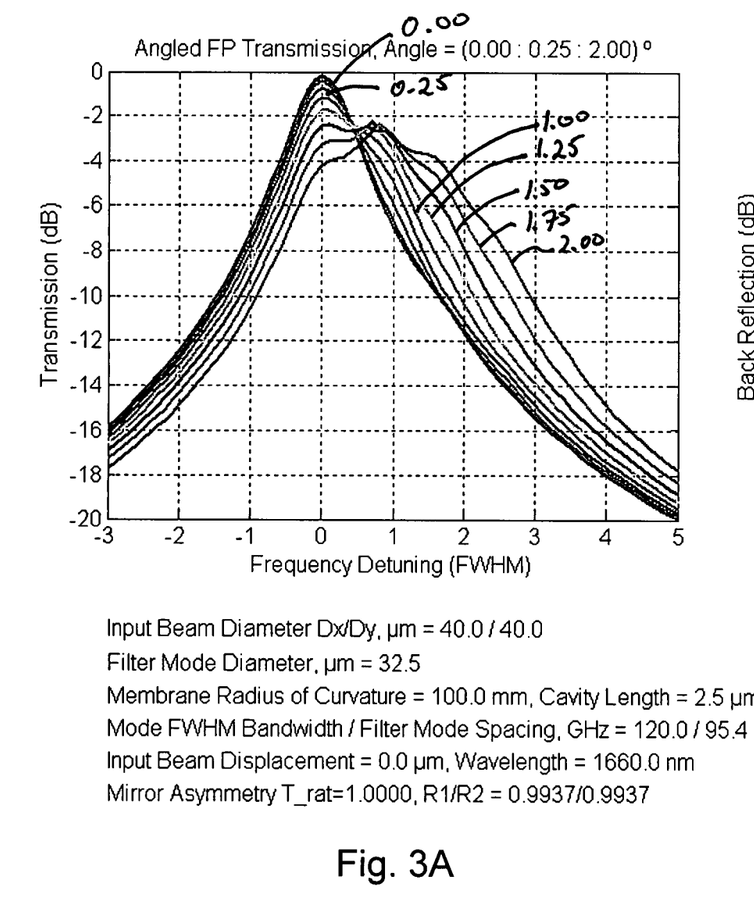
FIGS. 3A through 3C are plots of filter transmission, in decibels (dB), as a function of frequency detuning, in units of mode bandwidth full width half maximum (FWHM), illustrating the transmission for several different beam angles of incidence, the different figures illustrating filter transmission for different degrees of filter mirror asymmetry.

FIG. 3A illustrates how the calculated filter transmission changes as a function of frequency or wavelength, for different resonant filter tilt angles θ. In this illustrated example, the input Gaussian beam diameter is 40 micrometers in both the x and y axes, the filter mode diameter is 32.5 micrometers, the radius of curvature of the curved (membrane) mirror 212 is 100.0 millimeters and the length of the cavity 215 of the resonant filter 200 is 2.5 micrometers. There is no asymmetry in the reflectivity of the mirrors 210, 212 (i.e., $T_{rat}$=T2/T1=1.0), reflectivity of mirror 210 is R1=0.9937 and reflectivity of mirror 212 is R2=0.9937. As the angle θ of the filter changes in this multispatial mode resonant filter, the transmission changes.

Figure 4A:
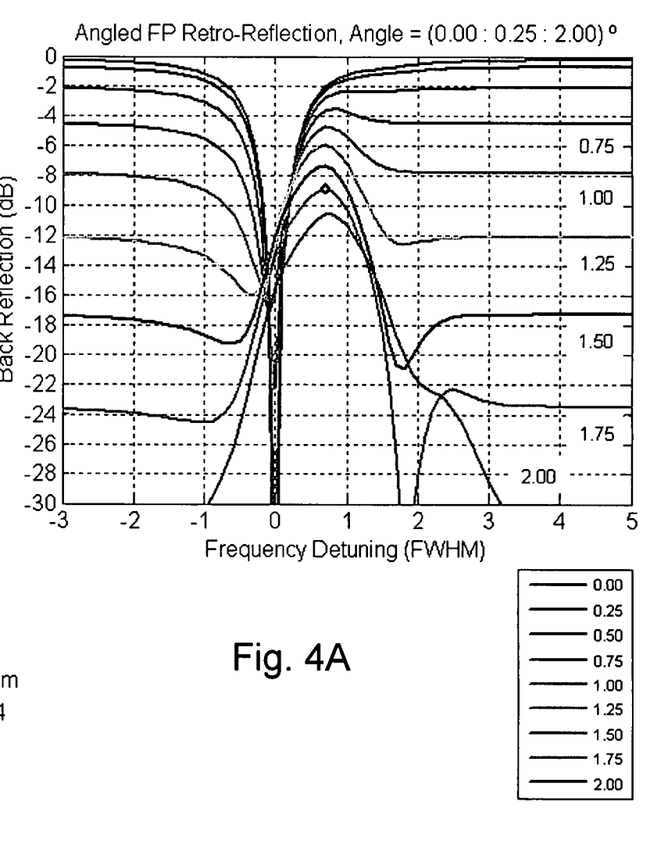
FIGS. 4A through 4C are plots of filter back reflection, in decibels (dB), as a function of frequency detuning FWHM, illustrating the back reflected, or retroreflected, signal for various beam angles of incidence relative to the nominal optical axis of the resonant filter, the different figures illustrating filter retroreflection for different degrees of filter mirror asymmetry.

FIG. 4A is a calculated plot of back reflection, specifically retro-reflection back into the incident Gaussian beam mode, as a function of frequency and is more relevant to its functioning in the laser cavity 112 such as in FIG. 1.

As the angle θ increases from about 0 degrees to 1.75 degrees, the back reflection evolves from the expected notch filter characteristic into a narrow band reflection with approximately 14 decibels (dB) isolation between the passband peak and the broadband feedback. Thus, in the preferred, current embodiment, angle θ is approximately between 0.75 and 3.0 degrees, preferably between 1.25 and 2.0 degrees.

Figure 3B:
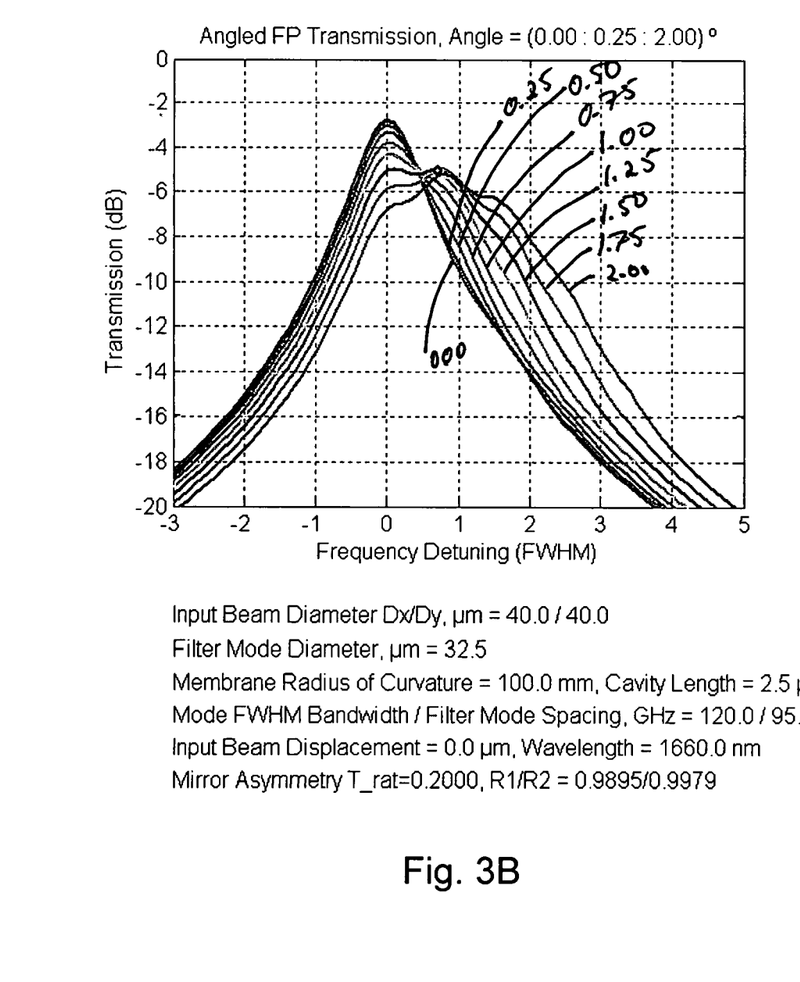

FIG. 3B illustrates how the calculated filter transmission changes as a function of frequency or wavelength, for different resonant filter tilt angles θ, for an asymmetric resonant filter in which $T_{rat}$=T2/T1.=0.20, with the other parameters unchanged. Here mirror T1 is facing the incident beam and mirror T2 is further away from the incident beam. Specifically, there is asymmetry in the reflectivity of the mirrors 210, 212, reflectivity of mirror 210, R1=0.9895 and reflectivity of mirror 212, R2=0.9979. As the angle θ of the filter changes in this multispatial mode resonant filter, the transmission changes.

Generally, in these unbalanced resonator configurations, $T_{rat}$ is usually less than 1.0, typically between 0.1 and 0.5, and can be less than 0.1 in some embodiments.

Figure 4B:
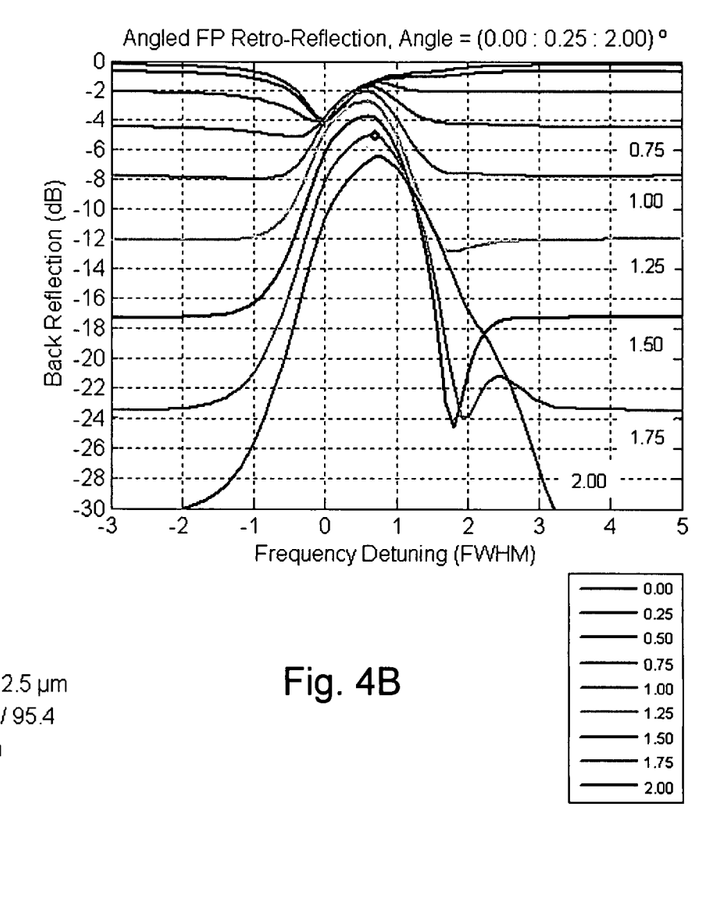

FIG. 4B is a plot of calculated back reflection, specifically retro-reflection back into the incident fundamental Gaussian beam mode, as a function of frequency for mirror asymmetry of $T_{rat}$=0.20 and is relevant to its functioning in the laser cavity 112 such as in FIG. 1.

As the angle θ increases from about 0 degrees to 1.75 degrees, the back reflection evolves from the now weak notch filter characteristic into a narrow band reflection with approximately 18 decibels (dB) isolation between the passband peak and the broadband feedback. Thus, in the preferred, current embodiment, angle θ is approximately between 0.75 and 3.0 degrees, preferably between 1.25 and 2.0 degrees. The product of mirror reflectivities R1*R2 in FIG. 4B is the same as in FIG. 4A, where for FIG. 4B reflectivity R1 was decreased and R2 increased relative to those in FIG. 4A. Thus the resulting filter retroreflection bandwidth is the same in FIGS. 4A and B, while the peak filter retroreflection magnitude has increased by 4 dB. Specifically, for the filter asymmetry of $T_{rat}$=1.0 in FIG. 4A the peak reflectivity at 1.75° angle is −9 dB, whereas for the filter asymmetry of $T_{rat}$=0.2 in FIG. 4B the peak reflectivity at 1.75° angle is −5 dB. This significant increase of peak retroreflection is very beneficial for external cavity laser configuration, as it decreases the laser threshold and increases the laser tuning range. There is a corresponding decrease of filter transmission at the retroreflection peak wavelength from −2.5 dB to −5 dB, some of which is due to increased retroreflection and some due to light lost to the angled reflection from the filter.

Figure 3C:
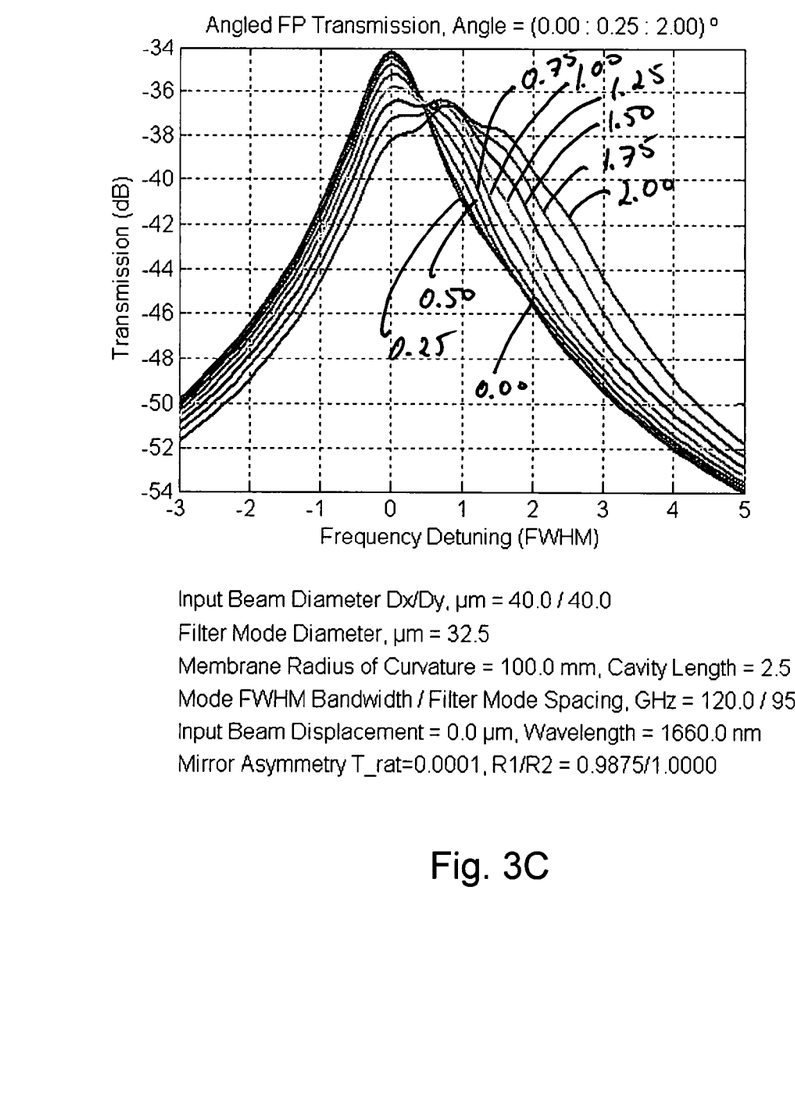

FIG. 3C illustrates how the calculated filter transmission changes as a function of frequency or wavelength, for different resonant filter tilt angles θ, for a resonant filter in which $T_{rat}$=T2/T1=0.0001, with the other parameters unchanged. Specifically, there is asymmetry in the reflectivity of the mirrors 210, 212, reflectivity of mirror 210, R1=0.9875 and reflectivity of mirror 212, R2~=1.000. As the angle θ of the filter changes in this multispatial mode resonant filter, the transmission changes.

Figure 4C:
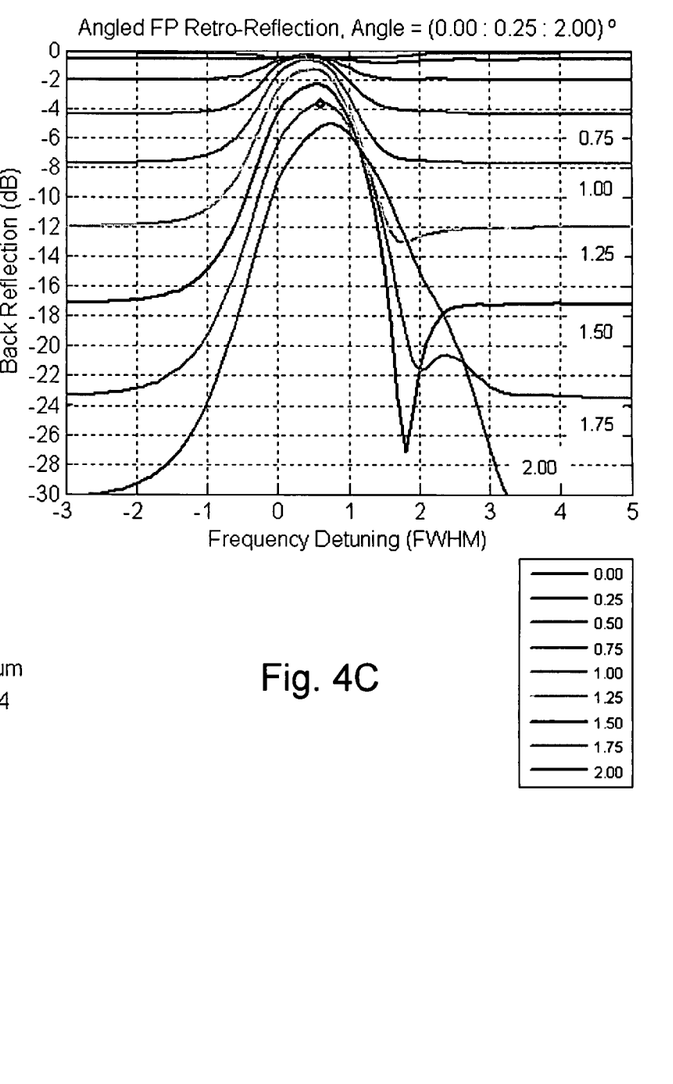

FIG. 4C is a plot of calculated back reflection, specifically retro-reflection back into the incident Gaussian beam mode, as a function of frequency for mirror asymmetry of $T_{rat}$=0.0001 and is relevant to its functioning in the laser cavity 112 such as in FIG. 1.

Mirror asymmetry $T_{rat}$=0.0001 in FIGS. 3C and 4C illustrates the Gires-Tournois interferometer configuration, where the external mirror reflectivity approaches unity. The product of the two mirror reflectivities R1*R2 here is the same as for FIGS. 3A,B and 4A,B; thus the filter retroreflection spectral bandwidth is the same for the three filter asymmetries of $T_{rat}$=1.0, 0.20, and 0.0001.

At normal incidence θ=0 in FIG. 4C, the GTI reflects essentially all the light with unity reflectivity across the spectrum. As the angle θ increases from about 0 degrees to 1.75 degrees, the back reflection evolves from the essentially flat unity reflectivity into a narrow band peak reflection with approximately 16 decibels (dB) isolation between the passband peak and the broadband feedback. Thus, in the preferred, current embodiment, angle θ is approximately between 0.75 and 3.0 degrees, preferably between 1.25 and 2.0 degrees. Filter retroreflection peak at 1.75° angle is even higher here at −4 dB, or at 40%, than for the asymmetry cases of $T_{rat}$=1.0 and 0.20. However, the filter transmission now is very low, as essentially all the light is now either retroreflected or reflected at an angle. When such GTI filter is used as an external cavity laser cavity mirror, the laser output has to be taken elsewhere in the cavity, for example from the other facet of the semiconductor gain chip or from an intracavity tap.

Figure 5:
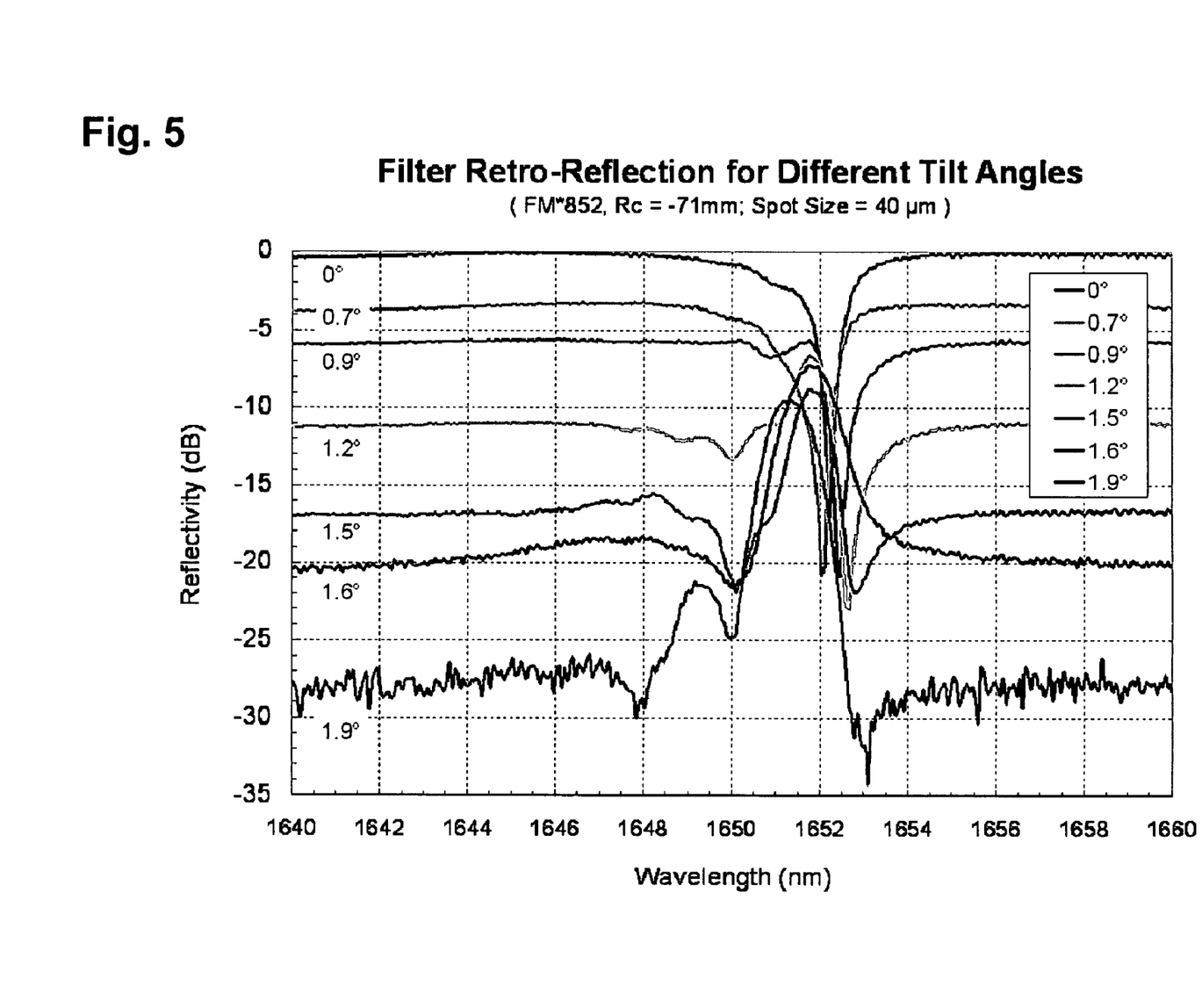
FIG. 5 is a plot of measured filter retro-reflection, in decibels (dB), as a function of wavelength, for various beam angles of incidence relative to the nominal optical axis of the resonant filter.

FIG. 5 is a plot of measured filter retroreflection back into the incident Gaussian beam as a function of wavelength for several incident beam angles. The spectral notch observed in retroreflection at zero degrees incident angle becomes a spectral peak when the incident angle is grater than approximately 1.5 degrees. This agrees with the calculated retroreflection spectra in FIG. 4A.

FIGS. 6A through 6F empirically illustrate why the resonant tunable filter 200 can function as a narrow band reflector when it is angled relative to the optical axis 120 of the laser cavity 112.

Figure 6A:
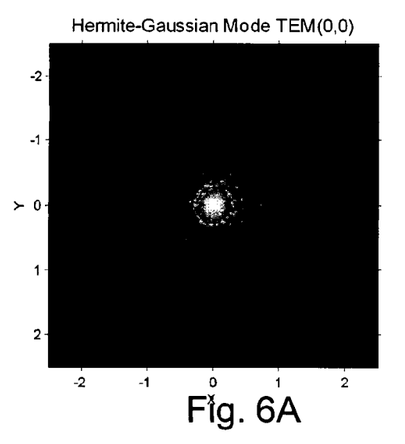
FIGS. 6A through 6F illustrate the lowest order mode (TEM (0,0)) Hermite-Gaussian mode, FIG. 6A, and the higher order modes, FIG. 6B though FIG. 6F, showing the various transverse spatial modes that can be supported by a resonant filter using a curved-curved or curved-flat cavity configuration such that these higher order modes are no longer degenerate in contrast to a flat-flat cavity.
Figure 6B:
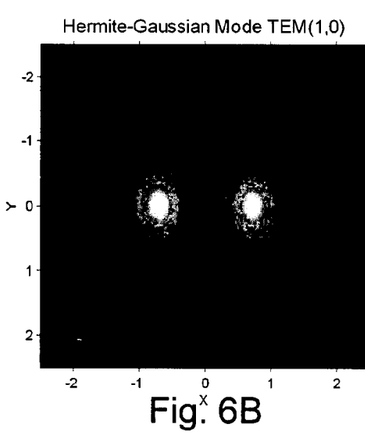
Figure 6C:
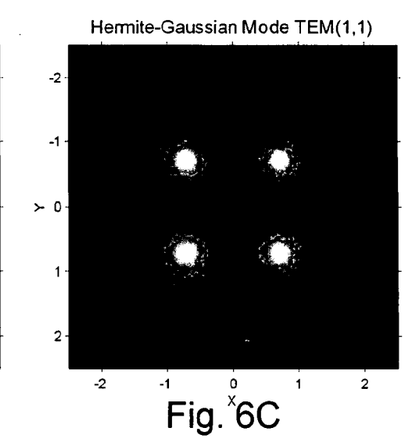
Figure 6D:
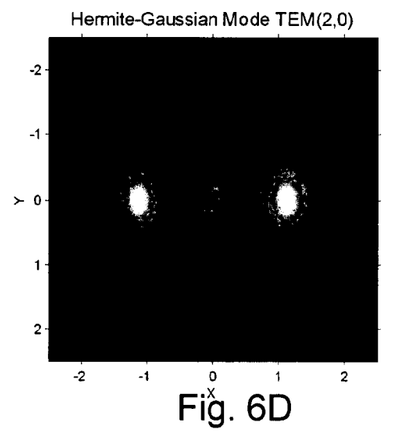
Figure 6E:
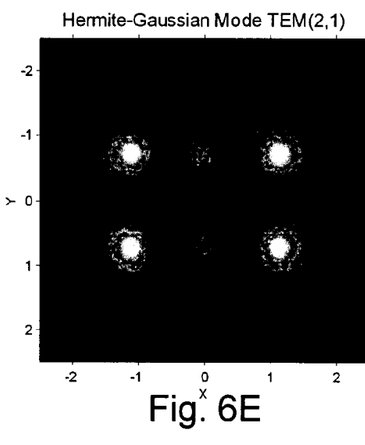
Figure 6F:
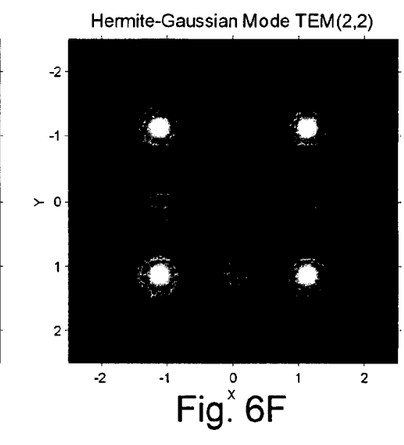

Generally, higher order transverse spatial modes are supported in a curved-flat or curved-curved resonator 200 and are excited due to the filter's positioning in the cavity relative to the incident beam. Thus, in addition to the lowest order mode, TEM (0,0), illustrated in FIG. 6A, higher order modes such as illustrated in FIGS. 6B, TEM (1,0), FIG. 6C TEM (1,1), FIG. 6D. TEM (2,0), FIG. 6E, TEM (2,1), and FIG. 6F. TEM (2,2) can be supported and excited in the resonant filter 200. These various higher order spatial modes have different resonant frequencies and thus different resonator transmission and reflection coefficients at the optical frequency of the incident light. These excited spatial modes then have amplitude and phase relationships relative to each other and the lowest order mode TEM (0,0), in reflection. For input beam incidence angles near zero degrees, phasing of the transverse modes creates a notch in the retro-reflected spectrum. The excited transverse mode relative amplitudes and phases depend on the input beam incidence angle $\theta$. By properly selecting the angle $\theta$ to be greater than zero or about 0.5 to 3 degrees, narrow band retro-reflection into the laser cavity can be created. This narrow band spectral reflection magnitude peak for certain beam incidence angles exists in these resonant reflective filters such as both for the Fabry-Perot and the Gires-Tournois interferometer (GTI) structures, even though at normal incidence the GTI is a phase-only reflection filter with unity magnitude spectral reflectivity. See for example FIG. 4C.

Figure 7:
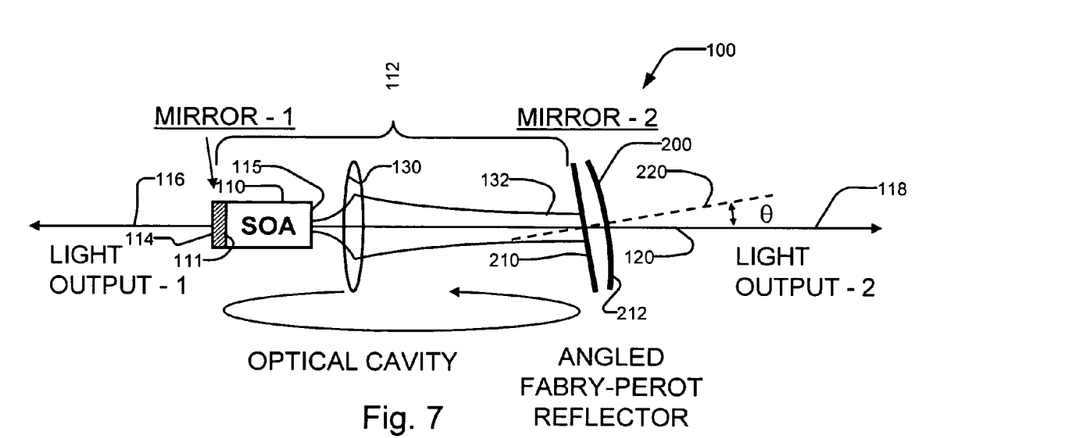
FIG. 7 illustrates an external cavity laser according to another embodiment of the present invention.

FIG. 7 illustrates another embodiment of the tunable ECL 100 of the present invention.

In this embodiment, a reflective SOA 110 is used. As a result, mirror-1 114 is a highly reflecting (HR) coated facet 111 of the SOA gain chip 110 to thereby create the first mirror of the laser cavity 112. The other mirror of the laser cavity is provided by the reflective resonant tunable filter 200. An intracavity lens 130 is used to collimate or collect the light from the AR coated facet 115 of the SOA 110 and generally form a beam waist 132 to launch the light into the resonant filter 200 and then couple light from the filter 200 back into the chip 110.

In this example, the light output from the laser cavity 112 can be either or both of light output-1 116 or light output-2 118. Further, an intra laser cavity tap could alternatively or additionally be used. In any of these configurations, the light output is typically focused and coupled into single mode fiber, polarization maintaining or other polarization controlling fiber.

Figure 8:
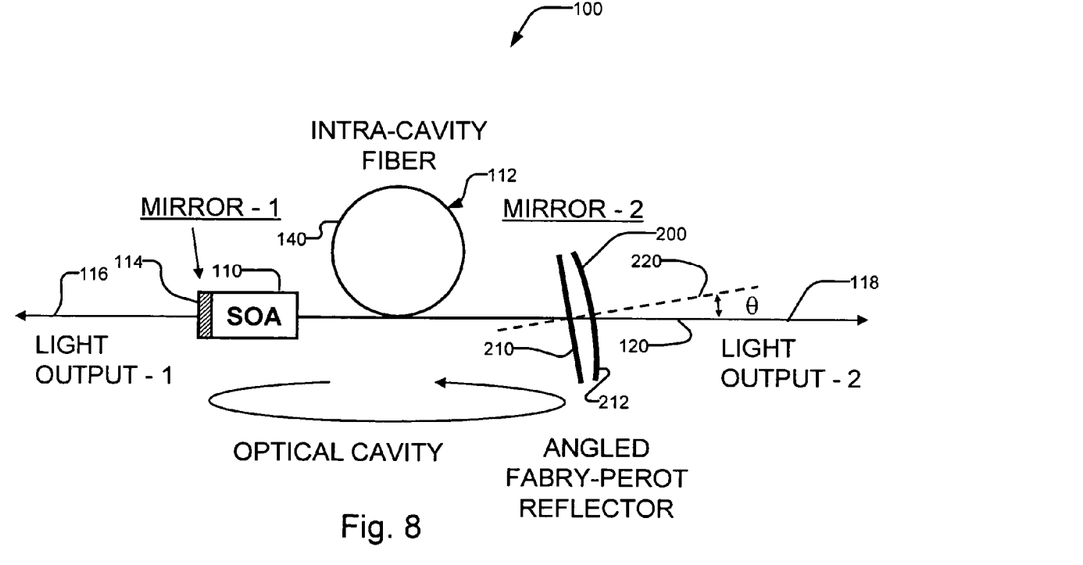
FIG. 8 illustrates an external cavity laser according to still another embodiment of the present invention.

FIG. 8 illustrates another embodiment in which an intracavity fiber 140 is used. This is used to increase the length of the cavity 112 to provide tighter longitudinal cavity mode spacing. This can improve the smoothness with which the laser is tuned, avoiding mode hopping noise.

Figure 9:
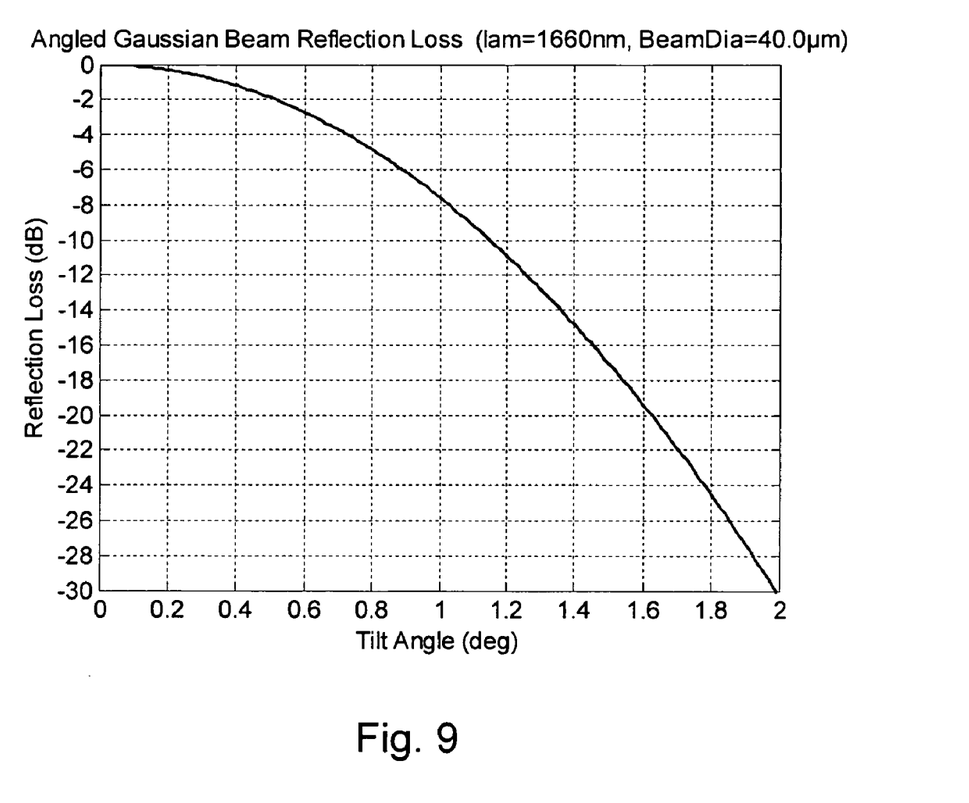
FIG. 9 is a plot of beam non-resonant retro-reflection loss, in dB, as a function of tilt angle or angle between the nominal axis of the resonant filter and the optical axis of the laser cavity, in degrees, showing the loss as the tilt angle is increased from zero to two degrees.

FIG. 9 is a plot of retro-reflection loss in decibels of a Gaussian beam reflected back onto itself by a 100% mirror as a function of the tilt angle between the beam and the mirror. Here the Gaussian beam diameter is 40 micrometers ($\mu$m) and the light wavelength is 1660 nm. This loss corresponds to the off-resonance reflection loss of the tilted reflective resonant filter, which can be observed in FIG. 4A, for example. This loss has to be sufficient to provide laser isolation from direct off-resonant filter reflection. Also, together with the peak of the resonant reflection, this loss defines the reflection filter peak contrast. Since the reflection peak is never greater than 1, or 0 dB, the reflection loss shown in FIG. 9 is the maximum possible reflective filter contrast. Thus to allow room for 10-15 dB of filter contrast, as well as sufficient direct reflection isolation, filter tilt angles of at least 1.2-2.0 deg. are typically desirable.

Figure 10:
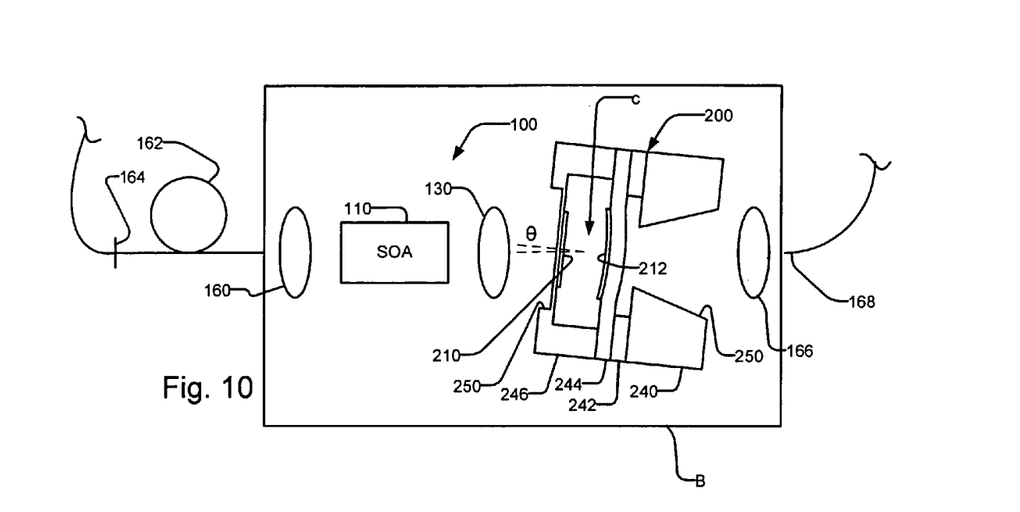
FIGS. 10-14 are schematic views of other embodiments of the inventive tunable laser.

FIG. 10 illustrates another embodiment of the tunable laser 100. It comprises an SOA gain chip 110. This is coupled to an optical fiber 162 via a lens 160. In one embodiment, a distant reflector 164, such as a mirror or a HR coated endface of the fiber is used to provide broadband feedback into the laser 100. In one embodiment, it can affect the cavity longitudinal modes by decreasing their frequency spacing and even push the laser into the coherence collapse regime, minimizing mode hopping noise.

The output from the SOA 110 is coupled into the tunable resonant filter 200, which defines and tunes the operating wavelength of the laser. In the illustrated example, the tunable filter 200 is similar to that disclosed in incorporated patents previously listed.

Specifically, the exemplary tunable filter 200 is MEMS implementation, illustrated here in cross-section, comprising a handle wafer substrate 240. An optical port 250 is formed through the handle wafer 240. An insulating, sacrificial layer 242 separates the handle wafer 240 from a membrane layer 244. This membrane layer 244 has been HR coated on one side to form thereby, in one embodiment, the curved mirror 212 of the resonant filter 200. A spacer 246 is attached to the membrane layer 244; this defines the filter resonant cavity c. The spacer also has a highly reflecting mirror coating that functions as the second mirror 210. In the illustrated embodiment, the spacer/mirror has an optical port 250 in it and around the optical axis. This optical port decreases the thickness of material along the optical axis to minimize the effect of the stray etalon formed between the HR coated mirror 210 and the opposite spacer surface which is anti-reflection coated.

The illustrated MEMS tunable filter 200 is electrostatically tuned by modulating a voltage between the handle wafer substrate 240 and the membrane layer 244. An increasing voltage progressively pulls the membrane of the membrane layer 244 toward the substrate 240 to thereby control or tune the optical size of the filter's optical cavity c and thus the center frequency of its narrowband reflection.

In other filter implementations, the size of the optical cavity is controlled via thermal tuning or electro optical tuning.

In another embodiment, spacers 246 are fabricated from Pyrex, instead of silicon or gallium phosphide.

All of the micro optical components, including lenses 130, 160, 166, SOA 110, filter 200 are preferably mounted on a common optical bench B to yield an highly integrated optical system.

Emission from the resonant tunable filter 200 can be coupled via lens 166 into an output fiber 168, which is preferably single mode fiber or polarization maintain fiber.

Figure 11:
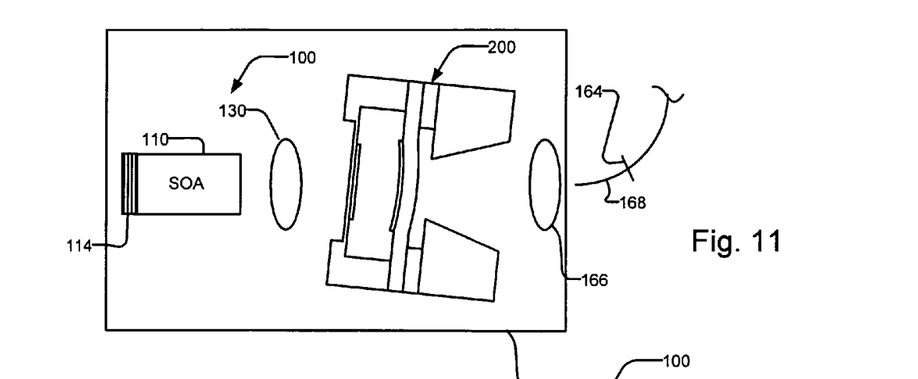

FIG. 11 illustrates another embodiment. This comprises a reflective SOA 110 having a mirror coating 114. It is optically coupled to the tunable resonant filter 200 via lens 130. The laser output is transmitted through the tunable filter 200 and is coupled via lens 166 to the output optical fiber 168, typically a single mode optical fiber or a polarization maintaining optical fiber.

In this embodiment, an external distant broadband reflector 164 is used in some examples in order to lower the threshold for the laser, broaden the laser tuning range, and to minimize mode hopping noise, such as by inducing coherence collapse or by decreasing the laser cavity longitudinal mode spacing.

Figure 12:
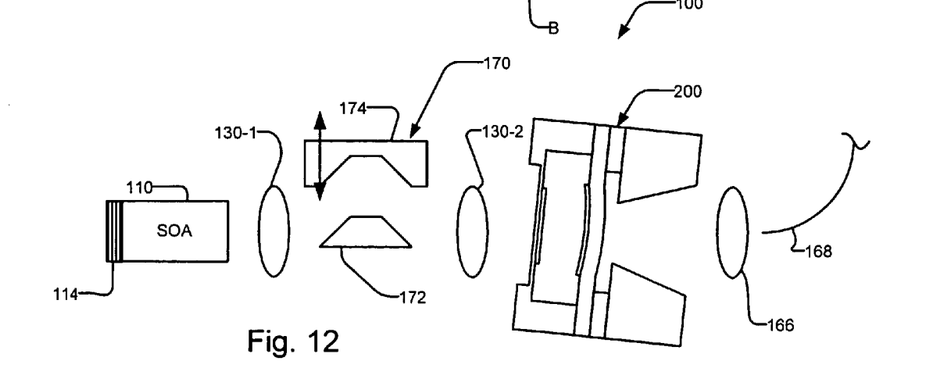

FIG. 12 illustrates another embodiment that includes a mechanism for controlling the cavity frequency modes. This embodiment utilizes a cavity length controller 170. Specifically, a first double angle reflector 172 and a second retroreflector 174 coordinate to enable the adjustment of the optical length of the cavity of the laser 100.

Specifically, in the illustrated embodiment, the retro-reflector component 174 moves laterally toward and away from the cavity reflector 172 in order to vary the optical frequency of the cavity modes. Thus, by adjusting the cavity length, in combination with tuning the tunable filter 200, the cavity modes can be controlled to overlap the filter reflection band and thereby enable continuous or quasi-continuous tunable single mode laser operation.

As illustrated in the embodiment, a reflective SOA 110 is used with the output being taken through the tunable filter to fiber 168. In this example, a reflector in the fiber 168 is typically not used although it can be helpful to lower the threshold and broaden the tuning range.

Generally, there must be a 20% length change in the cavity in order to enable the adjustment of the cavity modes to avoid mode hopping over 20% wavelength change tuning range.

Figure 13:
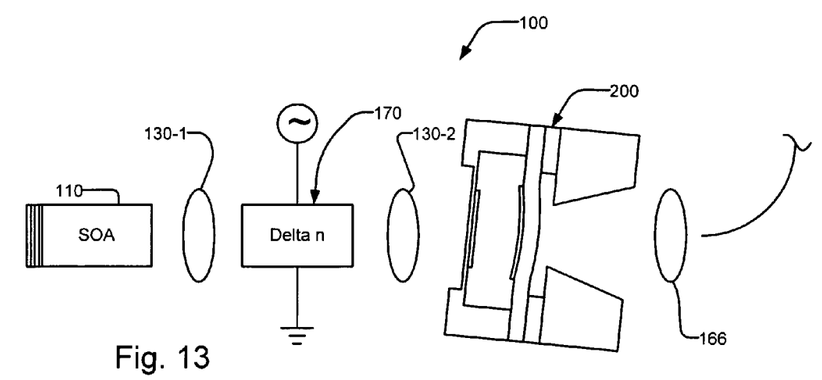

FIG. 13 illustrates another solution the controlling the cavity length. Specifically, this embodiment uses a component in which the refractive index (n) can be changed, such as electrically, to thereby function as the cavity length controller 170. One example of such material is available from Boston Applied Technologies, Inc. These are electro-optical, ceramic devices that are electrically modulated in order to control the refractive index. This allows for the optical length of the cavity to be modulated. In one embodiment, the cavity length is modulated with a high frequency source in order to scramble the cavity modes. In another embodiment, it is modulated in order to insure that a cavity mode overlaps with the reflection band of the tunable filter 200.

In still another embodiment, a dual membrane mirror device can be used as disclosed in U.S. patent application Ser. No. 10/743,238 to Paul Mattackal Verghese, filed on Dec. 22, 2003, entitled, "Dual Membrane Single Cavity Fabry Perot MEMS Filter", which application is incorporated herein in its entirety by this reference. In this embodiment, the combination of the two membranes is used to both tune the size of the tunable filter's cavity while also tuning the length of the laser cavity.

Figure 14:
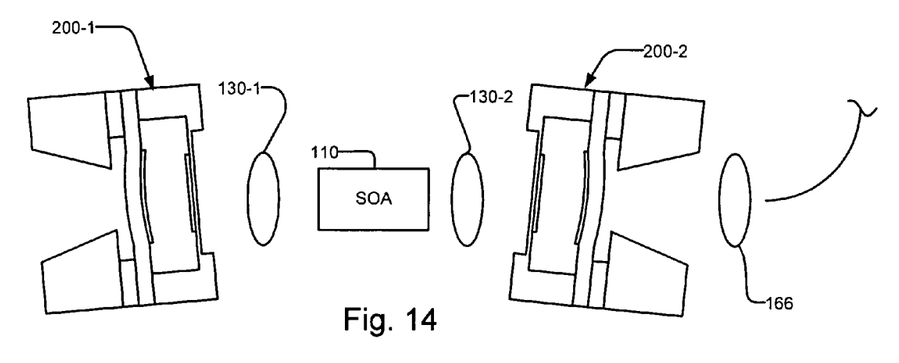

FIG. 14 illustrates another embodiment of the inventive tunable laser. This embodiment uses a combination of two tunable filters 200-1, 200-2. These have advantages in that tunable filters with relatively smaller but different free spectral ranges are used in combination to adjust the lasing wavelength of the cavity. Thus, they can be operated in a vernier system to thereby enable broader tuning range operation and narrow band operation with tunable filters that have relatively easier coatings to make.

Figure 15:
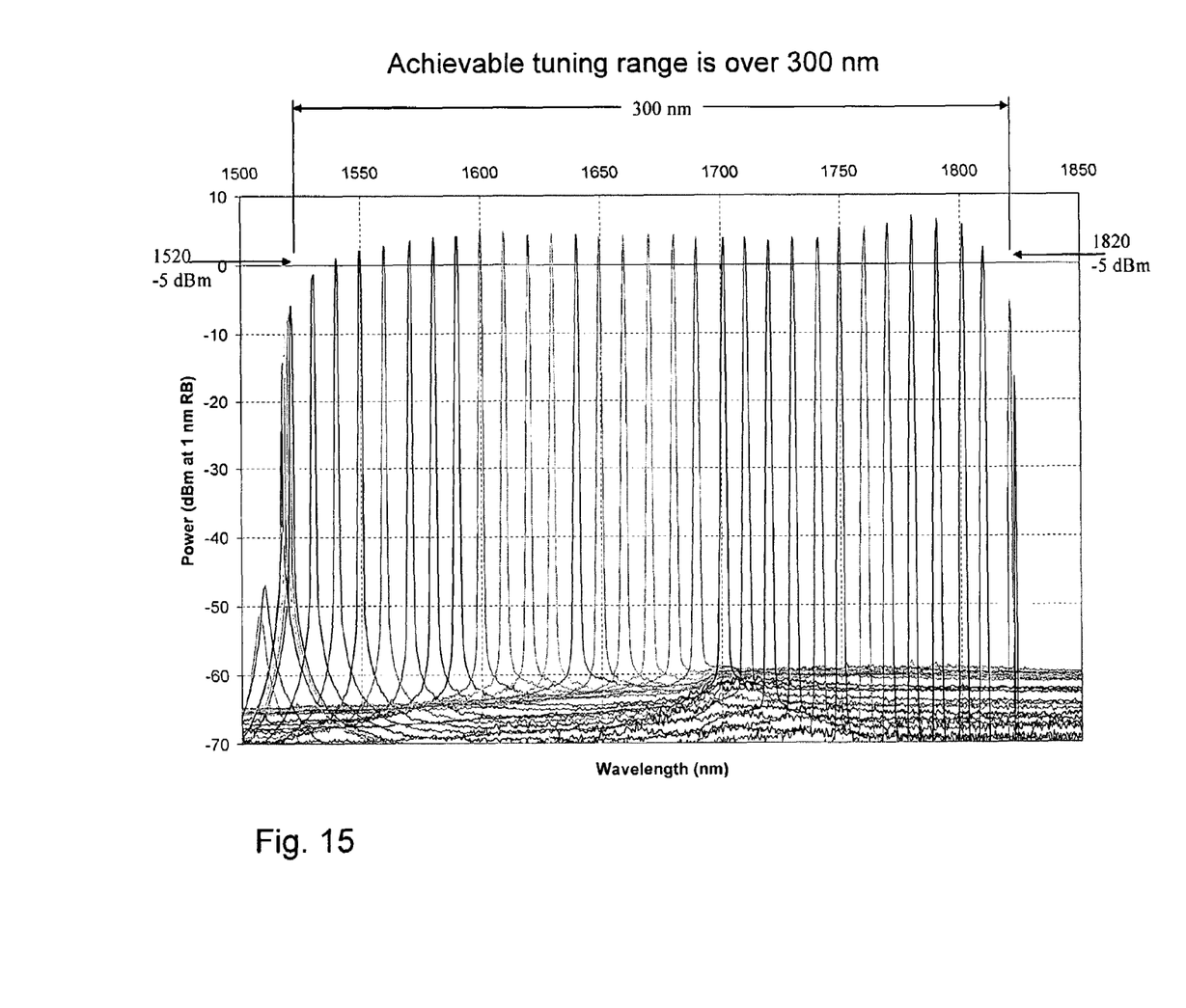
FIG. 15 shows superimposed measured multiple spectra of the inventive tunable laser as it was tuned over 300 nanometer (nm) wavelength tuning range.

FIG. 15 illustrates the tunable laser operation of the inventive tunable external cavity semiconductor laser using the inventive reflective resonant filter. The plot shows superimposed static measured multiple spectra of the inventive tunable laser as it was tuned over 300 nm wavelength tuning range to thereby generate a tunable signal. Also, rapid tuning of the laser with scan time of less than 1 second and usually less than 100 milliseconds (msec) to 30 msec, or less, across the full wavelength tuning range is obtained when the MEMS tunable filter voltage is varied.

Tunable lasers with wide tuning ranges, such as laser illustrated in FIG. 15, can be used for optical spectroscopic measurements; specifically for measuring wavelength dependent properties, such as those of articles of interest such as chemical substances, cellular tissues, and optical components and systems. The light from the article of interest is detected in order to resolve a spectroscopic response of the article.

While this invention has been particularly shown and described with references to preferred embodiments thereof, it will be understood by those skilled in the art that various changes in form and details may be made therein without departing from the scope of the invention encompassed by the appended claims. For example, the use of this reflective resonant tunable filter is not limited to tunable lasers but may be applied to other applications requiring tunable narrowband responses in refection. In this way, it could be applied to applications where gratings are used.

Further, the tunable lasers disclosed herein have additional applications beyond spectroscopy. These applications include: thickness measurements for semiconductor and MEMS fabrication/processing, optical coherence tomography/reflectometry, optical component characterization, harmonic generation, medical probes, and telecommunications systems.

What is claimed is:

1. A tunable external cavity laser, comprising
a gain medium for amplifying light within a laser cavity; and
a resonant tunable filter having an angular dependent spectral reflection response, the tunable filter being angled relative to the laser cavity providing feedback into the laser cavity and the gain medium, the resonant tunable filter being tuned in order to control the laser cavity output wavelength, wherein the resonant tunable filter supports multiple spatial modes and the feedback into the laser cavity includes at least one higher order spatial mode of the resonant tunable filter.

2. A laser as claimed in claim 1, wherein the gain medium is a solid state gain medium.

3. A laser as claimed in claim 1, wherein the gain medium is a semiconductor gain medium.

4. A laser as claimed in claim 3, wherein the semiconductor gain medium comprises an edge-emitting gain chip.

5. A laser as claimed in claim 3, wherein the gain medium comprises a semiconductor optical amplifier.

6. A laser as claimed in claim 3, wherein the gain medium comprises a reflective semiconductor optical amplifier.

7. A laser as claimed in claim 1, wherein the resonant tunable filter forms one end of the laser cavity.

8. A laser as claimed in claim 1, wherein the laser cavity includes a length of optical fiber.

9. A laser as claimed in claim 1, further comprising a lens in the laser cavity for coupling light between the gain medium and the resonant tunable filter.

10. A laser as claimed in claim 1, wherein an angle between optical axis of the resonant tunable filter and an optical axis of the laser cavity is between 0.75 and 3.0 degrees.

11. A laser as claimed in claim 1, wherein an angle between optical axis of the resonant tunable filter and an optical axis of the laser cavity is between 1.25 and 2.0 degrees.

12. A laser as claimed in claim 1, further comprising a lens between the resonant tunable filter and an output optical fiber for coupling light exiting the laser cavity into the output optical fiber.

13. A laser as claimed in claim 1, further comprising a cavity length modulator for modulating an optical length of the laser cavity.

14. A laser as claimed in claim 13, wherein the cavity length modulator comprises movable reflective elements.

15. A laser as claimed in claim 13, wherein the cavity length modulator comprises electro optical material.

16. A laser as claimed in claim 1, further comprising a second resonant tunable filter defining another end of the laser cavity.

17. A laser as claimed in claim 1, wherein the resonant tunable filter comprises two opposed mirrors.

18. A laser as claimed in claim 17, wherein the mirrors have substantially the same reflectivity.

19. A laser as claimed in claim 17, wherein the mirrors have different reflectivities.

20. A laser as claimed in claim 17, wherein the ratio of the smaller mirror transmission to the larger mirror transmission is less than 0.5.

* * * * *